(12) United States Patent
Isobata et al.

(10) Patent No.: US 11,285,713 B2
(45) Date of Patent: Mar. 29, 2022

(54) SCREEN PRINTING APPARATUS

(71) Applicant: Panasonic Intellectual Property Management Co., Ltd., Osaka (JP)

(72) Inventors: Yoshinori Isobata, Fukuoka (JP); Takaaki Sakaue, Yamanashi (JP); Ryo Senoo, Fukuoka (JP); Susumu Toyoda, Fukuoka (JP); Masahiro Morimoto, Fukuoka (JP); Yusuke Sueyasu, Fukuoka (JP); Seiya Kuroda, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/050,479

(22) PCT Filed: Apr. 10, 2019

(86) PCT No.: PCT/JP2019/015536
§ 371 (c)(1),
(2) Date: Oct. 26, 2020

(87) PCT Pub. No.: WO2019/208213
PCT Pub. Date: Oct. 31, 2019

(65) Prior Publication Data
US 2021/0187937 A1 Jun. 24, 2021

(30) Foreign Application Priority Data

Apr. 27, 2018 (JP) .............................. JP2018-086039

(51) Int. Cl.
*B41F 15/08* (2006.01)
*B41F 15/42* (2006.01)
(Continued)

(52) U.S. Cl.
CPC ...... *B41F 15/0818* (2013.01); *B41F 15/0881* (2013.01); *B41F 15/423* (2013.01);
(Continued)

(58) Field of Classification Search
CPC .............. B41F 15/0818; B41F 15/0881; B41F 15/46; B41F 15/423
See application file for complete search history.

(56) References Cited

U.S. PATENT DOCUMENTS 5,479,854 A * 1/1996 Chikahisa ............. B41F 15/423
101/123
6,612,231 B2 * 9/2003 Shimizu .................. B41F 15/44
101/114
(Continued)

FOREIGN PATENT DOCUMENTS

CN 1939718 A 4/2007
JP H10-000757 A 1/1998
(Continued)

OTHER PUBLICATIONS

International Search Report issued in Patent Application No. PCT/JP2019/015536 dated May 28, 2019.
Written Opinion issued in Patent Application No. PCT/JP2019/015536 dated May 28, 2019.
English Translation of Chinese Search Report dated Nov. 16, 2021 for the related Chinese Patent Application No. 201980027474.6.

*Primary Examiner* — Matthew G Marini
*Assistant Examiner* — Marissa Ferguson-Samreth
(74) *Attorney, Agent, or Firm* — Pearne & Gordon LLP

(57) ABSTRACT

A screen printing apparatus includes a squeegee driver that lifts/lowers a first lifting/lowering shaft and a second lifting/lowering shaft; a link mechanism including a swinging member that pivots about a horizontal axis by lifting/lowering operations of the first lifting/lowering shaft and the
(Continued)

second lifting/lowering shaft; a squeegee unit installed to the swinging member; and a controller that controls at least a height of the squeegee unit and an orientation of the squeegee unit in a rotating direction by controlling the squeegee driver.

11 Claims, 8 Drawing Sheets

(51) Int. Cl.
    *B41F 15/46*     (2006.01)
    *H05K 3/12*     (2006.01)
    *H05K 3/34*     (2006.01)

(52) U.S. Cl.
    CPC ............... *B41F 15/46* (2013.01); *H05K 3/12* (2013.01); *H05K 3/34* (2013.01)

(56) References Cited

U.S. PATENT DOCUMENTS

| | | | | |
|---|---|---|---|---|
| 9,352,409 | B2* | 5/2016 | Kuroda | ............... B23K 3/0638 |
| 2013/0145941 | A1* | 6/2013 | Kawai | ..................... B41F 15/34 |
| | | | | 101/123 |
| 2013/0291742 | A1* | 11/2013 | Abe | ......................... B41F 15/00 |
| | | | | 101/123 |
| 2015/0129640 | A1* | 5/2015 | Kuroda | ............... B23K 3/0638 |
| | | | | 228/41 |

FOREIGN PATENT DOCUMENTS

| | | | | |
|---|---|---|---|---|
| JP | H11-198348 A | | 7/1999 | |
| JP | 2006-321150 | * | 11/2006 | ............. B41F 15/40 |
| JP | 2013-18123 | * | 1/2013 | ............. B41F 15/40 |
| JP | 2013-043362 A | | 3/2013 | |

* cited by examiner

SCREEN PRINTING APPARATUS

This application is a U.S. national stage application of the PCT International Application No. PCT/JP2019/015536 filed on Apr. 10, 2019, which claims the benefit of foreign priority of Japanese Patent Application No. 2018-086039 filed on Apr. 27, 2018, the contents all of which are incorporated herein by reference.

TECHNICAL FIELD

The present disclosure relates to a screen printing apparatus that transfers a paste onto a print target using a mask having a plurality of pattern holes.

BACKGROUND ART

There is known a screen printing apparatus that transfers (prints) a paste such as cream solder onto a print target such as a substrate using a mask having a plurality of pattern holes (for example, PTL 1). The screen printing apparatus described in PTL 1 includes two reciprocating squeegees. In a case where the squeegees move in one direction, one of the squeegees is lowered onto a mask to print the paste, and in a case where the squeegees move in the opposite direction, the other squeegee is lowered onto the mask to print the paste. The two squeegees each have a motor capable of changing a tilt angle (attack angle) at which the squeegee comes into contact with the mask. A lowering amount and the tilt angle of the squeegee are set appropriately. Therefore, good printing can be performed according to types of the mask and the paste.

CITATION LIST

Patent Literature
PTL 1: Japanese Patent Unexamined Publication No. 10-757

SUMMARY OF THE INVENTION

A screen printing apparatus of the present disclosure for transferring a paste supplied to an upper surface of a mask having a plurality of pattern holes onto a print target disposed under the mask through the plurality of pattern holes while moving the paste with a squeegee unit, the screen printing apparatus including: a squeegee driver that lifts/lowers a first lifting/lowering shaft and a second lifting/lowering shaft; a link mechanism including a swinging member that pivots about a horizontal axis by lifting/lowering operations of the first lifting/lowering shaft and the second lifting/lowering shaft; a squeegee unit installed to the swinging member; and a controller that controls at least a height of the squeegee unit and an orientation of the squeegee unit in a rotating direction by controlling the squeegee driver.

According to the present disclosure, it is possible to change a lowering amount and a tilt angle of the squeegee with a simple configuration.

DESCRIPTION OF EMBODIMENTS

Figure 1:
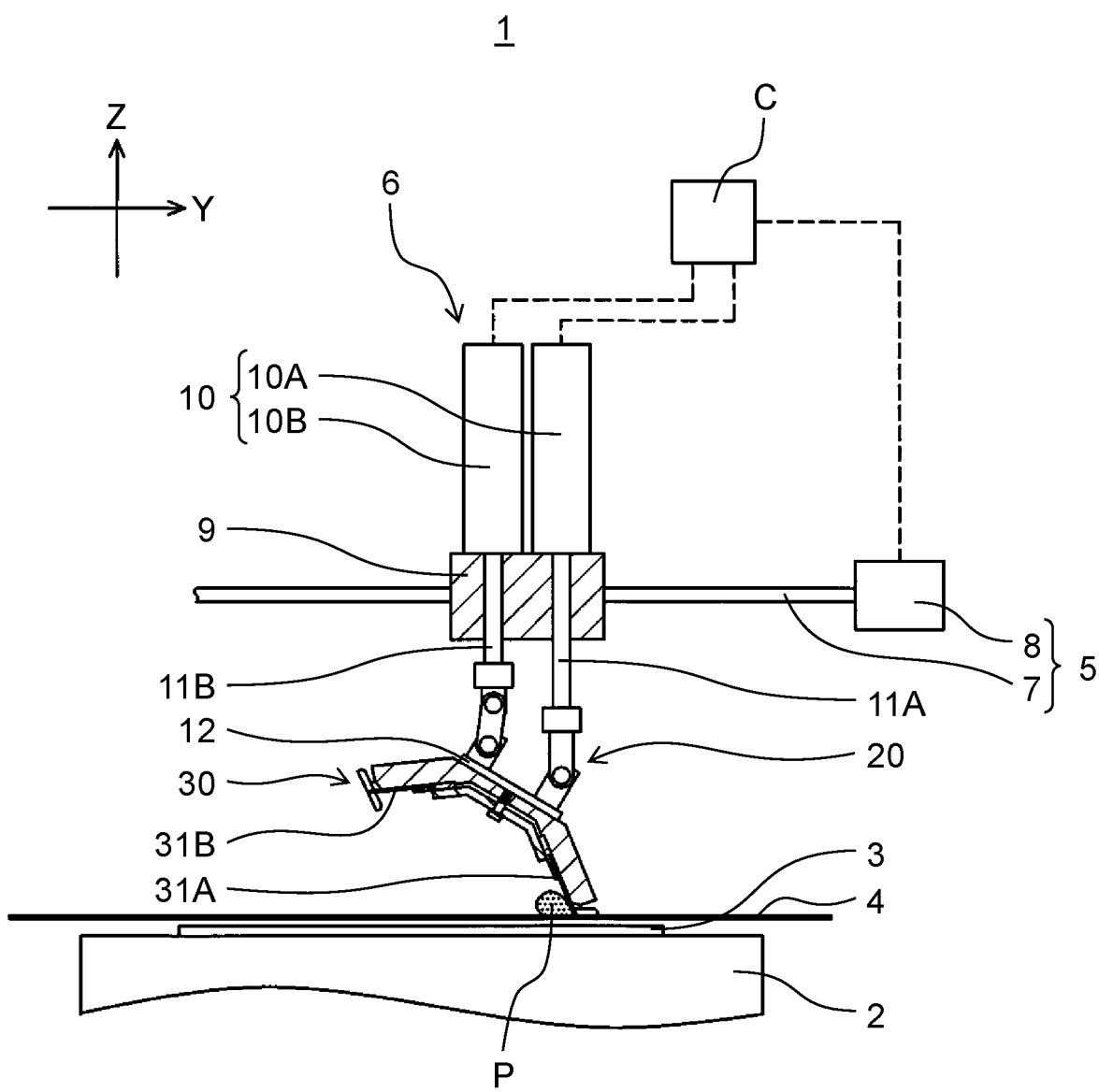
FIG. 1 is a structural explanatory view of a screen printing apparatus according to an embodiment of the present disclosure.

The screen printing apparatus described in PTL 1 described above requires two mechanisms for lifting and lowering the squeegee and two motors for changing the tilt angle in order to print by changing the lowering amount and the tilt angle of the two squeegees. Therefore, there is a problem that the mechanism is complicated and expensive.

An object of the present disclosure is to provide the screen printing apparatus in which the lowering amount and the tilt angle of the squeegee can be changed with a simple configuration.

Hereinafter, an embodiment of the present disclosure will be described in detail with reference to the drawings. Configurations, shapes, and the like described below are examples for description, and can be appropriately changed according to the specifications of the screen printing apparatus. In the following, corresponding elements are denoted by the same reference numerals in all the drawings, and redundant description will be omitted. Hereinafter, a substrate transport direction (horizontal direction in FIG. 2) is defined as an X direction, a direction (horizontal direction in FIG. 1) orthogonal to the X direction in a horizontal plane is defined as a Y direction, and a direction (vertical direction in FIG. 1) orthogonal to the horizontal plane is defined as a Z direction.

First, a structure of screen printing apparatus 1 will be described with reference to FIGS. 1 and 2. Substrate transport mechanism 2 is installed in the X direction on a base of screen printing apparatus 1. Screen printing apparatus 1 includes controller C. Substrate transport mechanism 2 is controlled by controller C, transports substrate 3 carried in from an upstream side in the X direction, and holds substrate 3 at a predetermined clamp position. Substrate transport mechanism 2 carries out substrate 3, on which a printing operation is completed, to a downstream side. Substrate 3 is a print target onto which paste P such as cream solder, flux, conductive adhesive, silver paste, or ink is transferred.

Mask 4 having a plurality of pattern holes for printing (transferring) paste P on substrate 3 is installed above substrate 3 held at the clamp position. Print head 6 moving in the Y direction by print head moving mechanism 5 is provided above mask 4. Print head moving mechanism 5 includes feed screw 7 extending in the Y direction and motor 8 rotationally driving feed screw 7. Print head 6 includes moving base 9 having a thread that engages with a thread of feed screw 7 and moving in the Y direction by the rotation of feed screw 7. Motor 8 is controlled by controller C, and rotationally drives feed screw 7 in the forward or reverse direction, whereby print head 6 including moving base 9 reciprocates in the Y direction.

Figure 2:
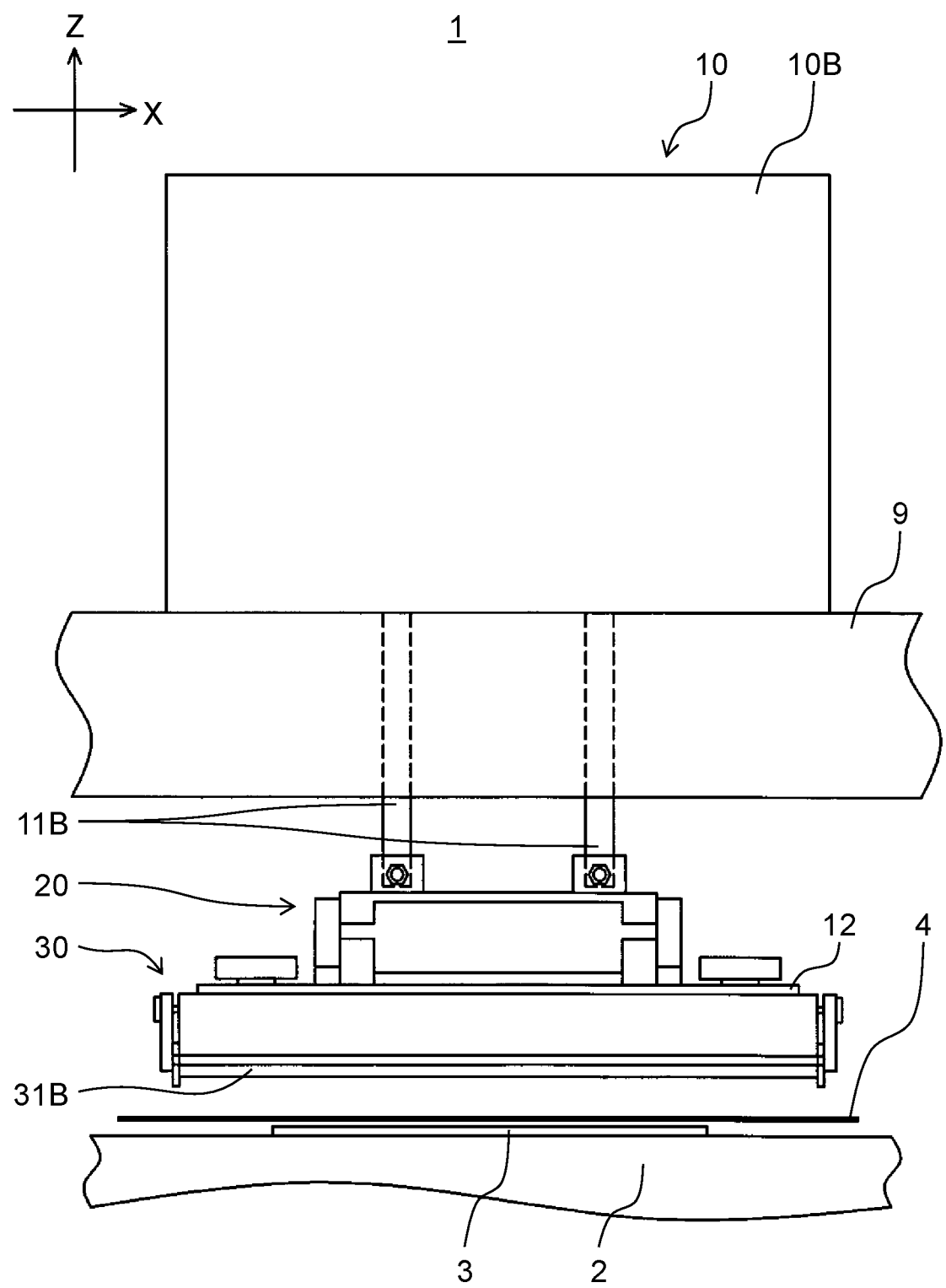
FIG. 2 is a front view illustrating a structure of the screen printing apparatus according to an embodiment of the present disclosure.

In FIGS. 1 and 2, print head 6 includes squeegee driver 10 on an upper portion of moving base 9. Squeegee driver 10 includes first driver 10A including a cylinder that drives first lifting/lowering shaft 11A extending downward to be lifted/lowered and the like, and second driver 10B including a cylinder that drives second lifting/lowering shaft 11B extending downward to be lifted/lowered and the like. The drivers 10A and 10B are disposed side by side in the Y direction.

First driver 10A is controlled by controller C, and simultaneously lifts/lowers two first lifting/lowering shafts 11A provided at predetermined intervals in the X direction. Second driver 10B is controlled by controller C, and simultaneously lifts/lowers two second lifting/lowering shafts 11B provided at the same intervals as the intervals between two first lifting/lowering shafts 11A in the X direction. Squeegee driver 10 lifts/lowers first lifting/lowering shaft 11A and second lifting/lowering shaft 11B individually.

In FIGS. 1 and 2, link mechanism 20 including swinging member 12 is connected to lower ends (that is, a lower end of print head 6) of first lifting/lowering shaft 11A and second lifting/lowering shaft 11B. Swinging member 12 pivots about the X axis (horizontal axis) by the lifting/lowering operations of first lifting/lowering shaft 11A and second lifting/lowering shaft 11B described later. Squeegee unit 30 is installed to the lower surface of swinging member 12. In squeegee unit 30, two blades having linear edges and extending in the X direction are held at predetermined intervals in the Y direction. Hereinafter, the blade on a side of first lifting/lowering shaft 11A is referred to as "first blade 31A", and the blade on a side of second lifting/lowering shaft 11B is referred to as "second blade 31B".

As described above, controller C controls squeegee driver 10 to control a height of squeegee unit 30 and an orientation of squeegee unit 30 in a rotating direction about the X axis, and controls print head moving mechanism 5 to allow squeegee unit 30 installed under print head 6 to reciprocate in the Y direction.

In FIG. 1, in screen printing apparatus 1, squeegee unit 30 is pivoted in a state where substrate 3 is held at the clamp position to allow one blade (first blade 31A in FIG. 1) to abut against an upper surface of mask 4. In screen printing apparatus 1, squeegee unit 30 transfers (prints) paste P supplied on the upper surface of mask 4 onto substrate 3 (print target) disposed under mask 4 through the plurality of pattern holes while being moved in one direction (left direction in FIG. 1) of the Y direction.

Figure 3A:
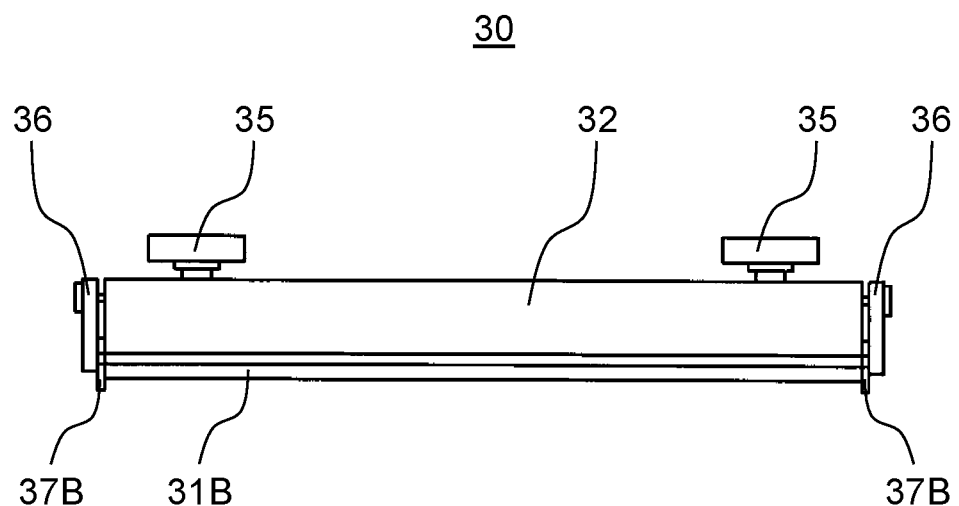
FIG. 3A is a front view of a squeegee unit included in the screen printing apparatus according to an embodiment of the present disclosure.
Figure 3B:
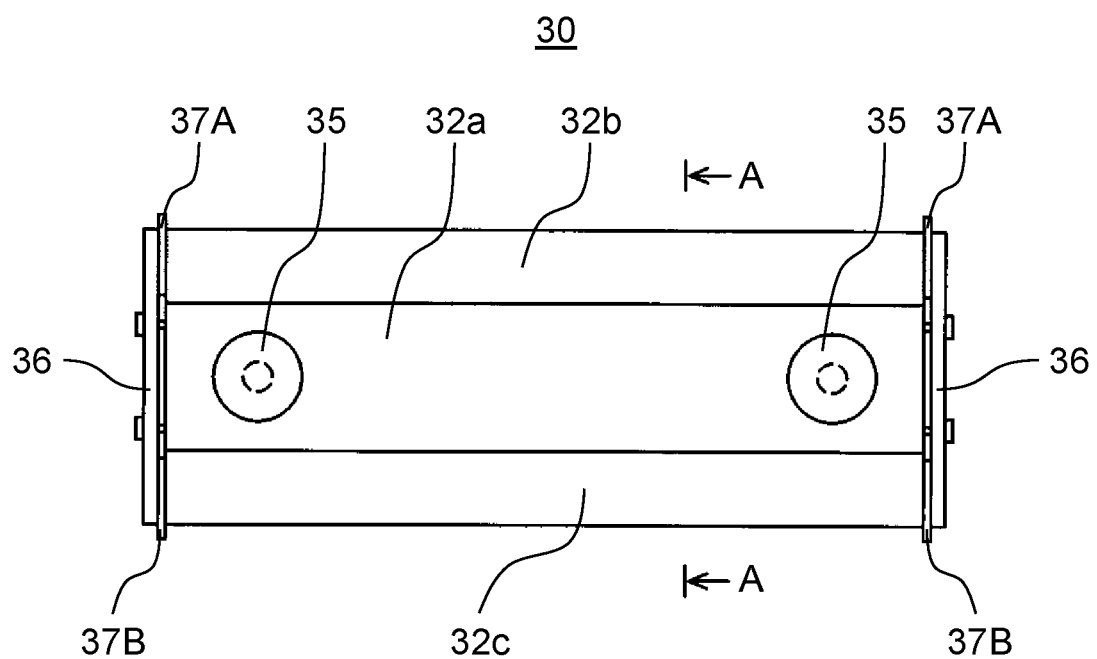
FIG. 3B is a plan view of the squeegee unit included in the screen printing apparatus according to an embodiment of the present disclosure.
Figure 4A:
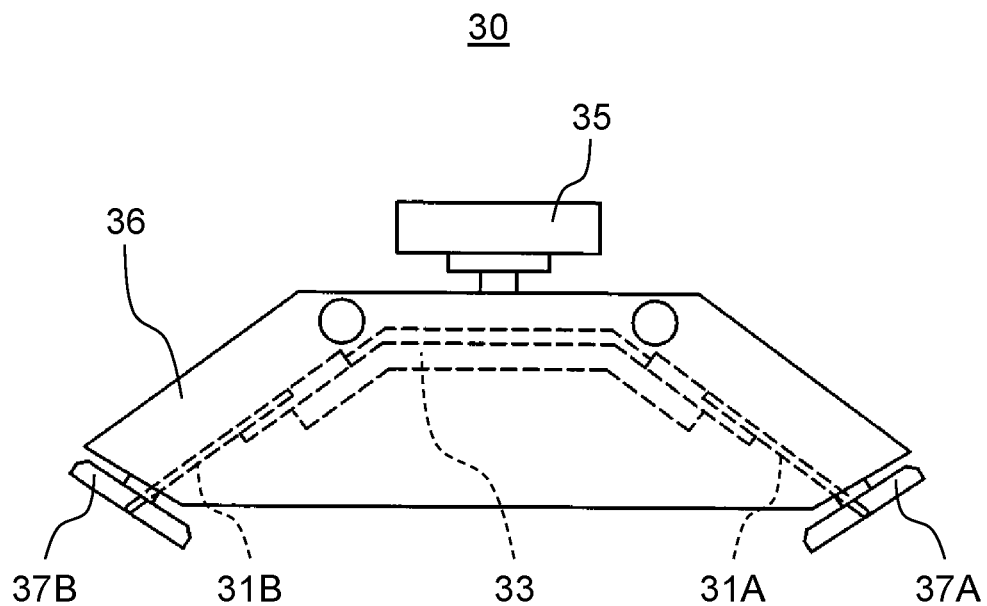
FIG. 4A is a side view of the squeegee unit included in the screen printing apparatus according to an embodiment of the present disclosure.
Figure 4B:
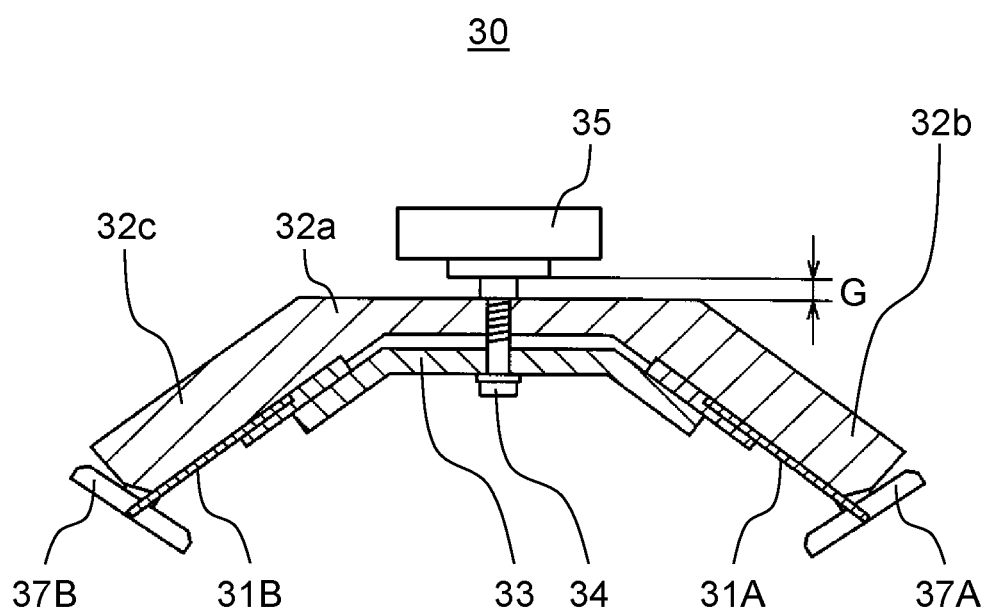
FIG. 4B is a side sectional view of the squeegee unit included in the screen printing apparatus according to an embodiment of the present disclosure.

Next, a configuration of squeegee unit 30 will be described with reference to FIGS. 3A, 3B, 4A, and 4B. FIG. 3A is a side view of squeegee unit 30 as seen from the moving direction (Y direction), and FIG. 3B is a plan view of squeegee unit 30 as seen from above. FIG. 4A is a side view of squeegee unit 30 as seen from a direction (X direction) orthogonal to the moving direction, and FIG. 4B is a sectional view taken along position A-A illustrated in FIG. 3B. Squeegee unit 30 includes blade holder 32 that holds first blade 31A and second blade 31B.

Blade holder 32 is configured to include horizontal portion 32a that spreads in the horizontal direction, and first holder 32b and second holder 32c that extend obliquely downward and outward from the front and rear of horizontal portion 32a in the moving direction of squeegee unit 30. First holder 32b and second holder 32c have a symmetrical shape with respect to a vertical plane (YZ plane) passing through a center of horizontal portion 32a in the moving direction (Y direction) of squeegee unit 30. First blade 31A is installed to the lower surface of first holder 32b, second blade 31B is installed to the lower surface of second holder 32c, and a part thereof is sandwiched and held between blade fixing tool 33 and blade holder 32.

In FIG. 4B, the upper surface of blade fixing tool 33 has a shape that follows the lower surface of horizontal portion 32a, a part of first blade 31A installed to the lower surface of first holder 32b, and a part of second blade 31B installed to the lower surface of second holder 32c. The thread formed on an outer periphery of fixing screw 34, which are inserted from below, penetrate blade fixing tool 33 and horizontal portion 32a, and protrude from the upper surface of horizontal portion 32a, and the thread formed on an inner periphery of fixing bolt 35 are engaged with each other and thereby blade fixing tool 33 is fixed to blade holder 32. In a state where fixing bolt 35 engages with fixing screw 34, fixing bolt 35 has a shape where gap G slightly wider than thickness T (see FIG. 6B) of swinging member 12 is formed between the lower surface of fixing bolt 35 and the upper surface of horizontal portion 32a.

Figure 5:
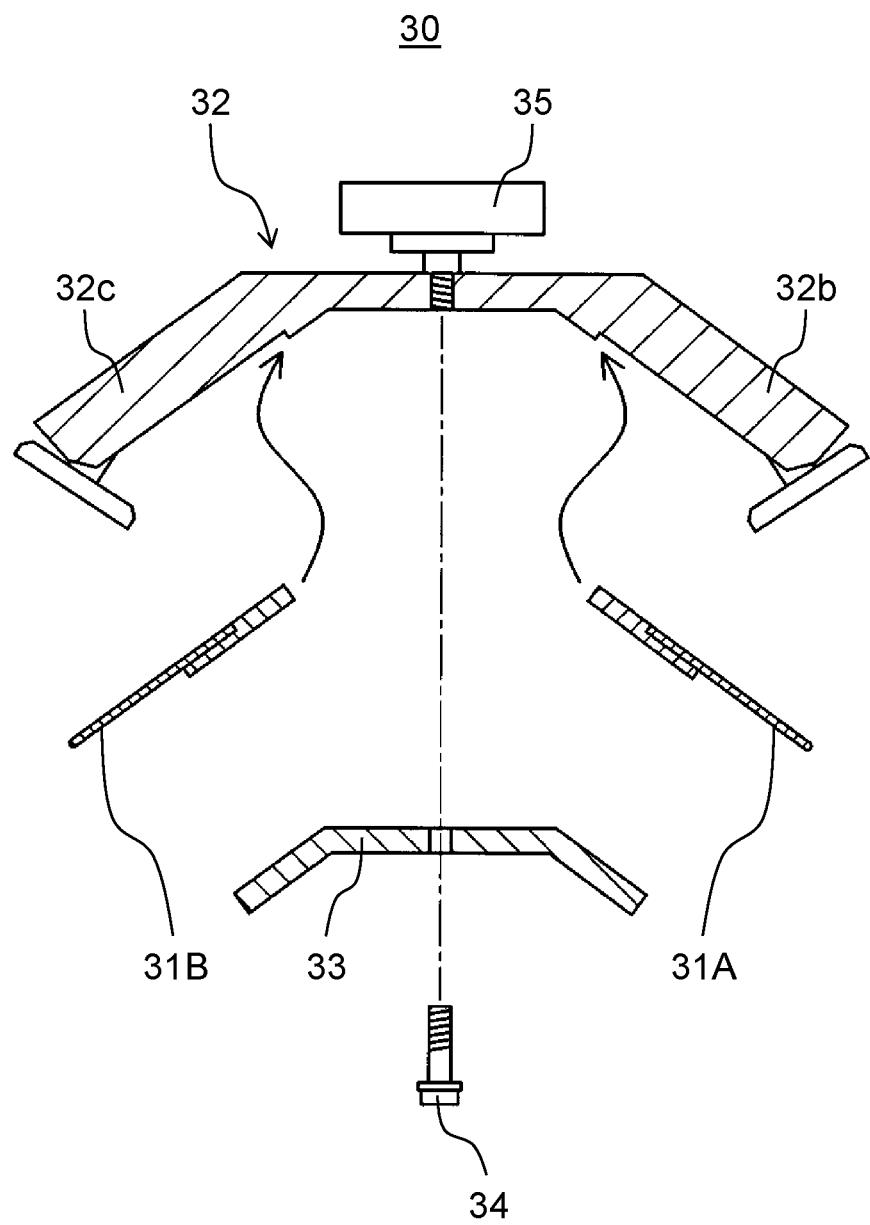
FIG. 5 is an explanatory view of assembling of the squeegee unit included in the screen printing apparatus according to an embodiment of the present disclosure.

A procedure for assembling squeegee unit 30 for installing first blade 31A and second blade 31B to blade holder 32 will be described with reference to FIG. 5. First, first blade 31A is attached to the lower surface of first holder 32b, second blade 31B is attached to the lower surface of second holder 32c, and the edge abutting against the upper surface of mask 4 faces downward. Next, blade fixing tool 33 is attached from below so as to follow the lower surface of blade holder 32, and fixing screw 34 is inserted from below.

Next, the thread of fixing bolt 35 is engaged, from above blade holder 32, with the thread of fixing screw 34 protruding from the upper surface of blade holder 32 through blade fixing tool 33 and blade holder 32. Therefore, first blade 31A and second blade 31B are held by blade holder 32 in a state where edges thereof face downward and a tilt angle of first blade 31A with respect to mask 4 is different from a tilt angle of second blade 31B with respect to mask 4.

In FIGS. 3A, 3B, and 4A, side plates 36 are respectively installed to both ends of blade holder 32 in the direction (X direction) orthogonal to the moving direction of squeegee unit 30. The side plate 36 is provided with first leakage prevention member 37A at a position corresponding to the edge of first blade 31A and second leakage prevention member 37B at a position corresponding to the edge of second blade 31B. First leakage prevention member 37A and second leakage prevention member 37B have a shape extending in the moving direction (Y direction) of squeegee unit 30.

When first blade 31A abuts against the upper surface of mask 4 to be moved, paste P on mask 4 spreads in a width direction (X direction) of first blade 31A. As described above, first leakage prevention member 37A prevents paste P spreading along first blade 31A from leaking from an end. Similarly, second leakage prevention member 37B prevents paste P spreading along second blade 31B from leaking from an end.

As described above, squeegee unit 30 includes a pair of first leakage prevention members 37A that prevents paste P from spreading from the center of first blade 31A in the width direction and leaking from both ends thereof by the movement of first blade 31A, and a pair of second leakage prevention members 37B that prevents paste P from spreading from the center of second blade 31B in the width direction and leaking from both ends thereof by the movement of second blade 31B.

Figure 6A:
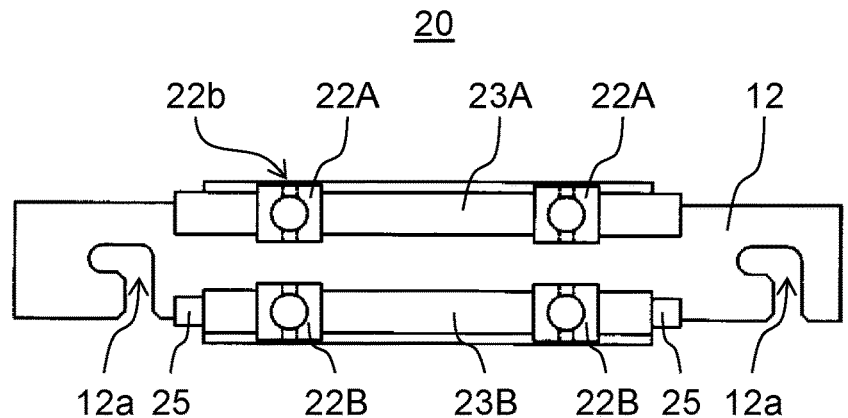
FIG. 6A is a plan view of a link mechanism included in the screen printing apparatus according to an embodiment of the present disclosure.

Next, a configuration of link mechanism 20 will be described with reference to FIGS. 6A, 6B, and 6C. In FIG. 6A, link mechanism 20 includes plate-shaped swinging member 12 that extends in the horizontal direction. Swinging member 12 is formed with a pair of slits 12a that is open to one side in the moving direction (Y direction) of squeegee unit 30 and internally bent into an L shape.

Figure 6B:
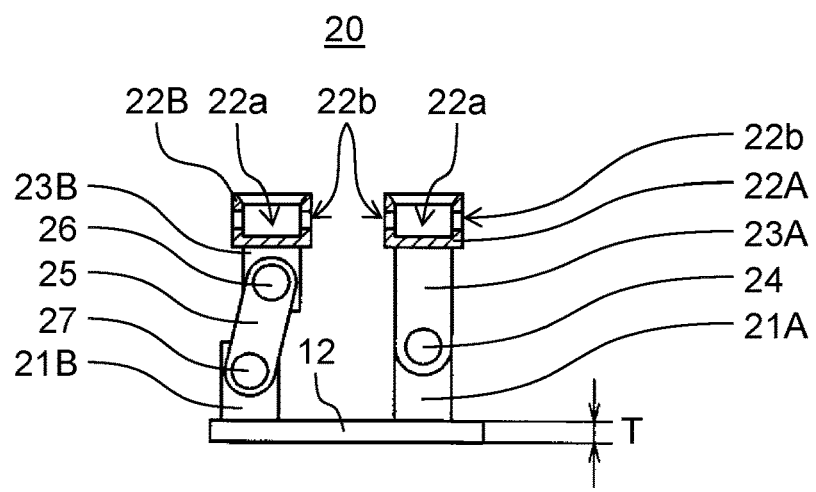
FIG. 6B is a side view of the link mechanism included in the screen printing apparatus according to an embodiment of the present disclosure.

In FIGS. 6A and 6B, a pair of first bearing portions 21A extending upward and a pair of second bearing portions 21B extending upward are formed on the upper surface of swinging member 12 at predetermined intervals in the moving direction (Y direction) of squeegee unit 30. The upper portion of the pair of first bearing portions 21A is connected to the lower portion of first lifting/lowering portion 23A by a pair of first joints 24. Two first connecting portions 22A, which extend in a direction (X direction) orthogonal to the moving direction of squeegee unit 30 and are respectively connected to the lower end portions of two first lifting/lowering shafts 11A, are formed on the upper portion of first lifting/lowering portion 23A. First lifting/lowering portion 23A and first bearing portion 21A pivot relative to each other about first joint 24 as a rotation axis.

The upper portions of the pair of second bearing portions 21B are connected to lower end portions (other end portions) of a pair of plate-shaped intermediate links 25 by a pair of third joints 27. The upper end portion (one end portion) of intermediate link 25 is connected to the lower portion of second lifting/lowering portion 23B by a pair of second joints 26 (see also FIG. 7A). Two second connecting portions 22B, which extend in the direction (X direction) orthogonal to the moving direction of squeegee unit 30 and are respectively connected to the lower end portions of two second lifting/lowering shafts 11B, are formed on the upper portion of second lifting/lowering portion 23B. Second lifting/lowering portion 23B and intermediate link 25 pivot relative to each other about second joint 26 as a rotation axis.

Intermediate link 25 and second bearing portion 21B pivot relative to each other about third joint 27 as a rotation axis.

Figure 6C:
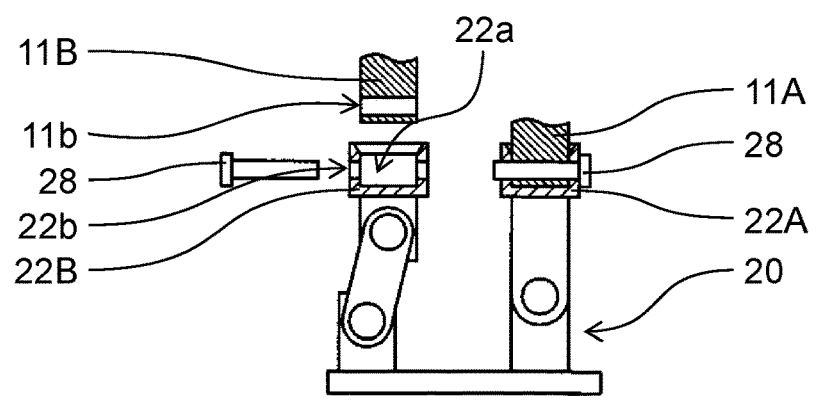
FIG. 6C is an explanatory view of a connection between the link mechanism and a lifting/lowering shaft included in the screen printing apparatus according to an embodiment of the present disclosure.

In FIGS. 6B and 6C, fitting portions 22a, which are open to the upper portion and into which the lower end portion of first lifting/lowering shaft 11A or second lifting/lowering shaft 11B is fitted, are formed in first connecting portion 22A and second connecting portion 22B. Through-holes 22b, through which connecting pins 28 inserted into lateral hole 11b formed at the lower end portion of first lifting/lowering shaft 11A or second lifting/lowering shaft 11B penetrates, are formed in first connecting portion 22A and second connecting portion 22B.

When link mechanism 20 is connected to the lower ends of first lifting/lowering shaft 11A and second lifting/lowering shaft 11B, the lower end portion of first lifting/lowering shaft 11A is fitted into fitting portion 22a of first connecting portion 22A. Thereafter, connecting pin 28 is inserted so as to sequentially pass through through-hole 22b of first connecting portion 22A and lateral hole 11b of first lifting/lowering shaft 11A to fix first lifting/lowering shaft 11A to first connecting portion 22A. Similarly, the lower end portion of second lifting/lowering shaft 11B is fitted into fitting portion 22a of second connecting portion 22B, and connecting pin 28 is inserted so as to sequentially pass through through-hole 22b of second connecting portion 22B and lateral hole 11b of second lifting/lowering shaft 11B to fix second lifting/lowering shaft 11B to second connecting portion 22B (see also FIG. 7A).

As described above, link mechanism 20 has first joint 24 connecting first lifting/lowering shaft 11A and swinging member 12, and intermediate link 25 of which one end portion (upper end portion) is connected to second lifting/lowering shaft 11B by second joint 26 and the other end portion (lower end portion) is connected to swinging member 12 by third joint 27.

Figure 7A:
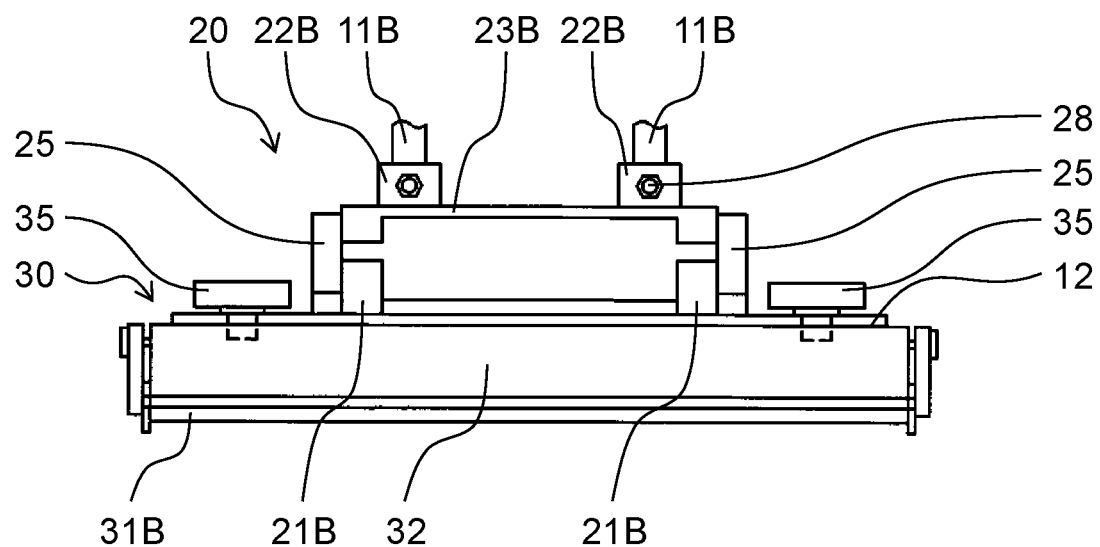
FIG. 7A is a front view in which the squeegee unit is installed to the link mechanism included in the screen printing apparatus according to an embodiment of the present disclosure.

Next, a procedure of installing squeegee unit 30 to swinging member 12 of link mechanism 20 connected to first lifting/lowering shaft 11A and second lifting/lowering shaft 11B will be described with reference to FIGS. 7A and 7B. First, gap G (see FIG. 4B) formed between fixing bolt 35 of squeegee unit 30 and blade holder 32 is inserted into the swinging member 12 from a direction of the opening of the pair of slits 12a formed in swinging member 12.

Figure 7B:
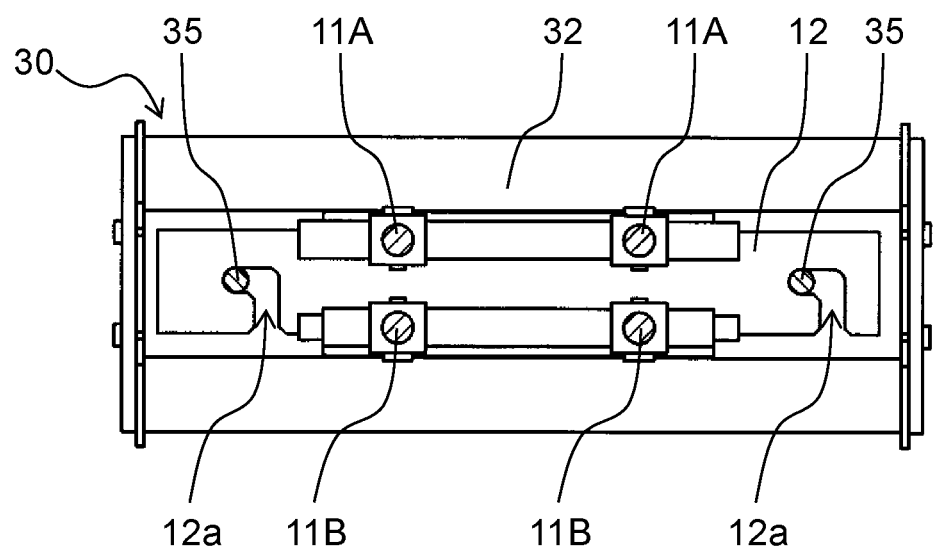
FIG. 7B is a plan view in which the squeegee unit is installed to the link mechanism included in the screen printing apparatus according to an embodiment of the present disclosure.

In this case, in a state where fixing bolts 35 are slightly loosened, the lower portions of two fixing bolts 35 are respectively inserted into the pair of slits 12a (squeegee unit 30 is moved downward on a paper plane of FIG. 7B). Thereafter, squeegee unit 30 is horizontally moved in an L shape along slit 12a (squeegee unit 30 is moved to a right direction on the paper plane of FIG. 7B), and the lower portion of fixing bolt 35 is positioned at a dead end of the slit 12a (position of squeegee unit 30 of FIG. 7B). Thereafter, fixing bolt 35 is tightened to fix squeegee unit 30 to swinging member 12.

In a case where squeegee unit 30 is removed from swinging member 12 of link mechanism 20, the procedure is the reverse of the above description. That is, fixing bolt 35 is loosened, squeegee unit 30 is moved in an L shape along slit 12a, and is removed from swinging member 12. As described above, squeegee unit 30 is attachable to and detachable from swinging member 12. That is, screen printing apparatus 1 according to the present embodiment is configured such that squeegee unit 30 can be easily attached to and detached from link mechanism 20 (swinging member 12), and further first blade 31A and second blade 31B can be easily attached to and detached from squeegee unit 30 (blade holder 32). Therefore, the blades (first blade 31A and second blade 31B) can be easily replaced and cleaned.

Link mechanism 20 can be removed from screen printing apparatus 1 by removing connecting pin 28 that fixes link mechanism 20 to first lifting/lowering shaft 11A and second lifting/lowering shaft 11B (see FIG. 6C). That is, link mechanism 20 is attachable to and detachable from first lifting/lowering shaft 11A and second lifting/lowering shaft 11B. A conventional squeegee unit (fixed angle squeegee unit) can be installed to the lower end portions of first lifting/lowering shaft 11A and second lifting/lowering shaft 11B from which link mechanism 20 is removed. Therefore, in screen printing apparatus 1 according to the present embodiment, it is possible to use the conventional squeegee unit together with squeegee unit 30.

Figure 8A:
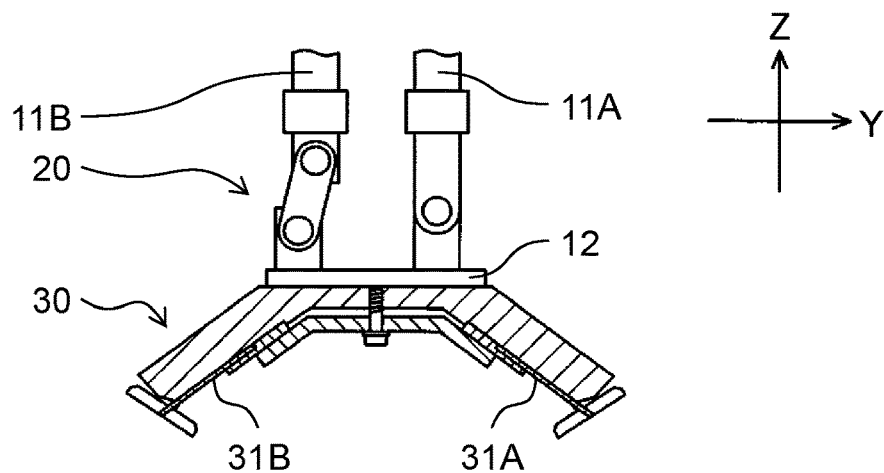
FIG. 8A is an explanatory view of orientation control of the squeegee unit in the screen printing apparatus according to an embodiment of the present disclosure.

Next, control of a height of squeegee unit 30 and an orientation of squeegee unit 30 in the rotating direction by controller C will be described with reference to FIGS. 8A, 8B, and 8C. FIG. 8A illustrates swinging member 12 in a horizontal state.

Figure 8B:
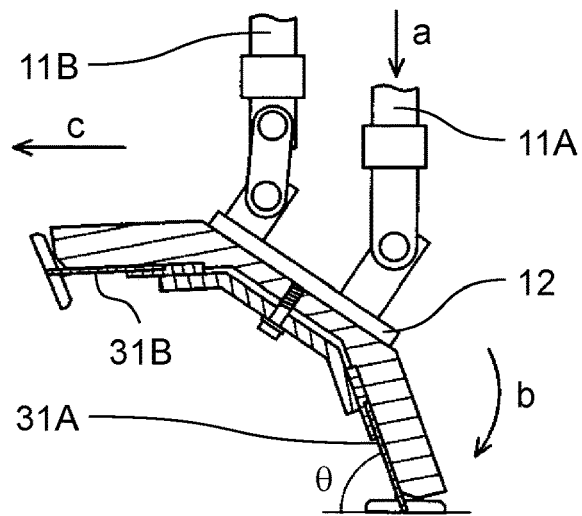
FIG. 8B is an explanatory view of orientation control of the squeegee unit in the screen printing apparatus according to an embodiment of the present disclosure.

FIG. 8B is an explanatory view for explaining control of transfer of paste P using first blade 31A by controller C. In a case where first blade 31A is used, controller C first controls first driver 10A of squeegee driver 10 to lower first lifting/lowering shaft 11A (arrow a). When first lifting/lowering shaft 11A lowers relative to second lifting/lowering shaft 11B, swinging member 12 pivots around the X axis in a direction in which first blade 31A lowers (arrow b), and tilt angle θ of first blade 31A becomes large. That is, by changing a relative lowering amount of first lifting/lowering shaft 11A, tilt angle θ changes when first blade 31A abuts against mask 4. As described above, controller C lowers first lifting/lowering shaft 11A to set first blade 31A at predetermined tilt angle θ.

Next, controller C controls first driver 10A and second driver 10B of squeegee driver 10 to simultaneously lower first lifting/lowering shaft 11A and second lifting/lowering shaft 11B by a same distance and first blade 31A abuts against the upper surface of mask 4 in a state where tilt angle θ is held. By changing the lowering amount with simultaneously lowering first lifting/lowering shaft 11A and second lifting/lowering shaft 11B, a pushing amount of first blade 31A against mask 4 changes. Next, controller C controls print head moving mechanism 5 while allowing the linear edge of first blade 31A set to predetermined tilt angle θ and a predetermined pushing amount to abut against the upper surface of mask 4, thereby moving squeegee unit 30 in one direction of Y direction (arrow c), and moving paste P on mask 4 in one direction.

Figure 8C:
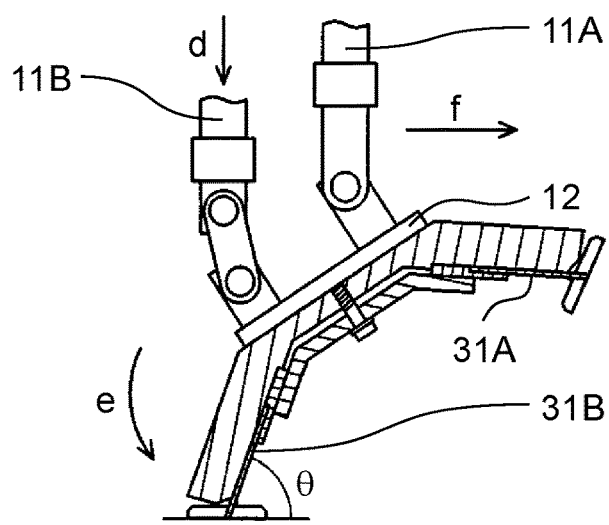
FIG. 8C is an explanatory view of orientation control of the squeegee unit in the screen printing apparatus according to an embodiment of the present disclosure.

FIG. 8C is an explanatory view for explaining control of transfer of paste P using second blade 31B by controller C. In a case where second blade 31B is used, controller C first controls second driver 10B of squeegee driver 10 to lower second lifting/lowering shaft 11B (arrow d). When second lifting/lowering shaft 11B lowers relative to first lifting/lowering shaft 11A, swinging member 12 pivots around the X axis in a direction in which second blade 31B lowers (arrow e), and tilt angle θ of second blade 31B becomes large.

When second blade 31B is set to predetermined tilt angle θ, controller C controls first driver 10A and second driver 10B to simultaneously lower first lifting/lowering shaft 11A and second lifting/lowering shaft 11B at the same distance, and allows second blade 31B to abut against the upper surface of mask 4 with a predetermined pushing amount. Next, controller C controls print head moving mechanism 5 while allowing the linear edge of second blade 31B set to predetermined tilt angle θ and a predetermined pushing amount to abut against the upper surface of mask 4, thereby moving squeegee unit 30 in a direction (arrow f) opposite to one direction of the Y direction, and moving paste P on mask 4 in the opposite direction.

As described above, swinging member 12 pivots about the X axis (horizontal axis) by the lifting/lowering operations of first lifting/lowering shaft 11A and second lifting/lowering shaft 11B, and the tilt angle θ between first blade 31A and second blade 31B changes. In screen printing apparatus 1 of the present embodiment, tilt angle θ of first blade 31A and second blade 31B, and the pushing amount (lowering amount) can be set to predetermined values by the lifting/lowering operations of first lifting/lowering shaft 11A and second lifting/lowering shaft 11B. Therefore, it is possible to easily perform appropriate printing according to the types of mask 4 and paste P.

In a case where a lowered position (or lowering amount) of first lifting/lowering shaft 11A and a lowered position (or lowering amount) of second lifting/lowering shaft 11B with predetermined tilt angle θ and a predetermined pushing amount are known in advance (stored), controller C may control squeegee driver 10 (first driver 10A and second driver 10B), so that first lifting/lowering shaft 11A and second lifting/lowering shaft 11B are simultaneously lowered and stopped at a predetermined lowered position.

As described above, screen printing apparatus 1 according to the present embodiment includes squeegee driver 10 that lifts/lowers first lifting/lowering shaft 11A and second lifting/lowering shaft 11B; link mechanism 20 including swinging member 12 that pivots about the horizontal axis by the lifting/lowering operations of first lifting/lowering shaft 11A and second lifting/lowering shaft 11B; squeegee unit 30 installed to swinging member 12; and controller C for controlling at least the height of squeegee unit 30 and the orientation of squeegee unit 30 in the rotating direction by controlling squeegee driver 10. Paste P supplied to the upper surface of mask 4 having the plurality of pattern holes is transferred, through the plurality of pattern holes, to the print target (substrate 3) disposed under mask 4 while being moved with squeegee unit 30. Therefore, the lowering amount (pushing amount) and the tilt angle θ of first blade 31A and second blade 31B (squeegee) can be changed with a simple configuration.

In the above description, substrate 3 such as a printed circuit substrate on which electronic components are mounted is described as an example of the print target on which screen printing apparatus 1 prints paste P, but the print target is not limited to substrate 3. For example, the print target may be clothing such as a T-shirt on which paste P such as ink is printed, glass, or ceramics.

INDUSTRIAL APPLICABILITY

The screen printing apparatus of the present disclosure has an effect that the lowering amount and the tilt angle of the squeegee can be changed with a simple configuration, and is useful in the field of mounting components on the substrate.

REFERENCE MARKS IN THE DRAWINGS 1 screen printing apparatus
3 substrate (print target)
4 mask
10 squeegee driver
11A first lifting/lowering shaft 11B second lifting/lowering shaft
12 swinging member
20 link mechanism
24 first joint
25 intermediate link
26 second joint
27 third joint
30 squeegee unit
31A first blade
31B second blade
32 blade holder
37A first leakage prevention member
37B second leakage prevention member
C controller
P paste

What is claimed is:

1. A screen printing apparatus for transferring a paste supplied to an upper surface of a mask having a plurality of pattern holes onto a print target disposed under the mask through the plurality of pattern holes while moving the paste with a squeegee unit, the screen printing apparatus comprising:
a squeegee driver including a first driver configured to vertically move a first shaft and a second driver configured to vertically move a second shaft;
a link mechanism including a swinging member configured to pivot about a horizontal axis by vertical movement of either the first shaft and the second shaft;
the squeegee unit installed to the swinging member; and
a controller operably connected to the first driver and the second driver and configured to move the first shaft or the second shaft to control an orientation of the squeegee unit, and configured to simultaneously move both the first shaft and the second shaft to control a height of the squeegee unit.

2. The screen printing apparatus according to claim 1, wherein the squeegee unit includes:
a first blade configured to move the paste on the upper surface of the mask in one direction while allowing a linear edge of the first blade to abut against the upper surface of the mask;
a second blade configured to move the paste on the upper surface of the mask in a direction opposite to the one direction while allowing a linear edge of the second blade to abut against the upper surface of the mask; and
a blade holder configured to hold the first blade and the second blade in a state where the linear edge of the first blade and the linear edge of the second blade face downward and a tilt angle of the first blade with respect to the mask is different from a tilt angle of the second blade with respect to the mask.

3. The screen printing apparatus according to claim 2, wherein the squeegee unit further includes:
a pair of first leakage prevention members configured to prevent the paste from leaking from both ends of the first blade due to the movement of the first blade; and
a pair of second leakage prevention members configured to prevent the paste from leaking from both ends of the second blade due to the movement of the second blade.

4. The screen printing apparatus according to claim 1, wherein the squeegee unit includes a first blade and a second blade, and wherein the first driver is configured to move the first shaft to thereby change a first tilt angle of the first blade, and wherein the second driver is configured to move the second shaft to thereby change a second tilt angle of the second blade.

5. A screen printing apparatus for transferring a paste supplied to an upper surface of a mask having a plurality of pattern holes onto a print target disposed under the mask through the plurality of pattern holes while moving the paste with a squeegee unit, the screen printing apparatus comprising:
a squeegee driver configured to vertically move a first shaft and a second shaft;
a link mechanism including a swinging member configured to pivot about a horizontal axis by vertical movement of the first shaft and the second shaft;
the squeegee unit installed to the swinging member; and
a controller configured to control at least an orientation and a height of the squeegee unit in a rotating direction of the squeegee unit by controlling the squeegee driver,
wherein the link mechanism further includes:
a first joint connecting the first shaft to the swinging member;
an intermediate link having one end portion and another end;
a second joint connecting the one end portion of the intermediate link to the second shaft; and
a third joint connecting the other end of the intermediate link to the swinging member.

6. The screen printing apparatus according to claim 1, wherein the squeegee unit is attachable to and detachable from the swinging member.

7. The screen printing apparatus according to claim 1, wherein the link mechanism is attachable to and detachable from the first shaft and the second shaft.

8. The screen printing apparatus according to claim 1, wherein the swinging member is configured to pivot by lifting or lowering the first shaft or the second shaft.

9. The screen printing apparatus according to claim 1, wherein the squeegee unit further comprises a blade holder including a horizontal portion, a first holder, and a second holder, wherein the first holder and the second holder each extend obliquely downward from the horizontal portion, and wherein a first blade is attached to the first holder and a second blade is attached to the second holder.

10. The screen printing apparatus according to claim 9, further comprising a blade fixing tool that includes a contour that is complementary to a contour of the horizontal portion of the blade holder.

11. The screen printing apparatus according to claim 1, wherein the link mechanism further comprises:
a first lifting/lowering portion connected to the first shaft and a second lifting/lowering portion connected to the second shaft;
an intermediate link pivotally connected to the second lifting/lowering portion; and
a first bearing portion and a second bearing portion extending upwardly from the swing member, wherein the first bearing portion is pivotally connected to the first lifting/lowering portion, and wherein the second bearing portion is pivotally connected to the intermediate link.

* * * * *